United States Patent [19]
Ihara

[11] Patent Number: 6,075,739
[45] Date of Patent: Jun. 13, 2000

[54] SEMICONDUCTOR STORAGE DEVICE PERFORMING SELF-REFRESH OPERATION IN AN OPTIMAL CYCLE

[75] Inventor: Makoto Ihara, Nara, Japan

[73] Assignee: Sharp Kabushiki Kaisha, Osaka, Japan

[21] Appl. No.: 09/022,585

[22] Filed: Feb. 12, 1998

[30] Foreign Application Priority Data

| | | | |
|---|---|---|---|
| Feb. 17, 1997 | [JP] | Japan | 9-031861 |
| Oct. 29, 1997 | [JP] | Japan | 9-296909 |

[51] Int. Cl.[7] .................................................. G11C 7/00
[52] U.S. Cl. .............. 365/222; 365/185.25; 365/185.27; 365/203
[58] Field of Search ............................... 365/222, 185.25, 365/203, 185.27

[56] References Cited

U.S. PATENT DOCUMENTS

| | | | |
|---|---|---|---|
| 5,757,715 | 5/1998 | Williams et al. | 365/230.03 |
| 5,818,268 | 10/1998 | Kim et al. | 327/77 |
| 5,867,438 | 2/1999 | Nomura et al. | 365/222 |
| 5,898,343 | 4/1999 | Morgan | 331/57 |

FOREIGN PATENT DOCUMENTS

| | | |
|---|---|---|
| 61-50287 | 3/1986 | Japan . |
| 61-139995 | 6/1986 | Japan . |
| 61-214297 | 9/1986 | Japan . |
| 62-40694 | 2/1987 | Japan . |
| 2-137186 | 5/1990 | Japan . |

*Primary Examiner*—David Nelms
*Assistant Examiner*—Tuan T. Nguyen
*Attorney, Agent, or Firm*—Morrison & Foerster, LLP

[57] ABSTRACT

A semiconductor storage device has a leak-monitoring capacitor connected to a bit line pre-charge potential generator, and a pre-charging transistor for charging one end of the leak-monitoring capacitor with a first potential (Vcc). The bit line pre-charge potential generator discharges from the leak-monitoring capacitor an amount of electric charges corresponding to a leak generated at a bit line pre-charge potential line which is connected with bit lines. A refresh timer circuit generates a clock signal in a cycle corresponding to a time in which the potential of the one end of the leak-monitoring capacitor decreases from the first potential (Vcc) to a second potential.

16 Claims, 10 Drawing Sheets

OUTPUT $P_2$ OF 616

POTENTIAL AT N

OUTPUT OF 611

OUTPUT OF 614

SEMICONDUCTOR STORAGE DEVICE PERFORMING SELF-REFRESH OPERATION IN AN OPTIMAL CYCLE

BACKGROUND OF THE INVENTION

The present invention relates to a dynamic type semiconductor storage device (DRAM) and a pseudo static type semiconductor storage device (pseudo SRAM) each of which has memory cells each comprised of a transistor and a capacitor and which have a self-refresh function. In particular, the present invention relates to a semiconductor storage device provided with a refresh timer circuit for generating a clock signal in a refresh cycle corresponding to leak characteristics of the memory cell capacitors in a self-refresh mode.

Generally, in the DRAM and the pseudo SRAM each having a built-in refresh timer circuit, the refresh cycle in the self-refresh mode is set to a fixed time interval based on the leak characteristics of preparatorily evaluated memory cells. More specifically, the refresh cycle is set in anticipation of the worst conditions attributed to the temperature dependency of a leak current after the completion of a chip and a fluctuation in the fabricating process. As a result, the refresh cycle hitherto used is shorter than the actually required refresh interval. That is, hitherto the refresh operation has been performed more frequently than required. This disadvantageously prevents a consumption current in the self-refresh stage from being saved.

With respect to the temperature dependency of the leak current, the leak current is reduced by about half every time the temperature falls by 10° C. Therefore, it should be acceptable to prolong the refresh cycle (time interval of the refresh operation) to about the double every time the temperature falls by 10° C. On the other hand, with respect to the consumption current in the self-refresh mode, it is approximately in inverse proportion to the refresh cycle. Therefore, if a refresh time interval can be set in accordance with the actual leak current, then it will be able to reduce the consumption current in the self-refresh mode especially when the temperature is low.

In view of the above, Japanese Patent Laid-Open Publication No. HEI 2-137186, Japanese Patent Laid-Open Publication No. SHO 61-50287, Japanese Patent Laid-Open Publication No. SHO 61-139995, Japanese Patent Laid-Open Publication No. SHO 61-214297 and Japanese Patent Laid-Open Publication No. SHO 62-40694 propose semiconductor storage devices whose refresh cycle is set according to the temperature dependency of the leak current as described below.

(First Prior Art)

In a semiconductor dynamic memory device disclosed in the Japanese Patent Laid-Open Publication No. HEI 2-137186, the leak current of a pn junction element having a temperature-leak characteristic similar to that of a memory cell is monitored instead of monitoring the leak current of the memory cell.

FIG. 9 shows a timing generator for generating a self-refresh clock of this semiconductor dynamic memory device. In FIG. 9 are shown a pn junction 511 provided on a semiconductor substrate, a p-channel MOS transistor 512, a voltage detector 513 in which an even number of CMOS inverters are connected in series, and a delay circuit 514 for delaying the output waveform of the voltage detector 513, those totally constituting a first oscillator 518. There are further shown a second oscillator 519 which can be started and stopped by a signal, and a counter circuit 520. Each of the delay circuit 514, the second oscillator 519 and the counter circuit 520 is formed by a CMOS. The source of the transistor 512 is connected to a power source 517 and its drain is connected to a first terminal (the n-type semiconductor side) 515 of the pn junction 511. A second terminal (the p-type semiconductor side) 516 of the pn junction 511 is connected to the semiconductor substrate or the ground potential The first terminal 515 is connected to the input of the voltage detector 513, and the output of the voltage detector 513 is connected to the gate of the transistor 512 via the delay circuit 514. The output of the voltage detector 513 is also connected to a start signal input terminal 521 of the second oscillator 519, while the output of the second oscillator 519 is connected to the counter circuit 520 and at the same time drawn out as a self-refresh clock to an output terminal 523. The output of the counter circuit 520 is connected to a stop signal input terminal 522 of the second oscillator 519.

The pn junction 511 shown in FIG. 9 and pn junctions included in memory cells are fabricated on an identical substrate through an identical fabricating process.

The operation of the semiconductor dynamic memory device of the first prior art will be described below. FIG. 10 is a timing chart for explaining the operation of the first oscillator 518 shown in FIG. 9, and FIG. 11 shows an enlarged view of a portion XI enclosed by the dashed lines in FIG. 10. If the first terminal 515 is charged up to a power voltage of 5 V and thereafter disconnected from the power source, then the voltage at the first terminal 515 reduces as the time elapses due to a leak current in the reverse direction of the pn junction 511. When this voltage reaches a detection level to be detected by the voltage detector 513, the output waveform of the voltage detector 513 is inverted to a low-level. In response to this, after a lapse of a delay time D, the delay circuit 514 also becomes inverted so as to apply a low-level voltage to the gate of the transistor 512. Then, the p-channel transistor 512 is turned on to make the power source 517 continuous with the first terminal 515. Then, the voltage at the first terminal 515 starts to increase due to a current flowing from the power source 517, and the output of the voltage detector 513 switches to a high-level when the voltage at the first terminal 515 again reaches the voltage detection level. Subsequently, after a lapse of the delay time D a high-level voltage is again applied to the gate of the transistor 512 to turn off the transistor 512, so that the first terminal 515 is disconnected from the power source. The first terminal 515 is completely charged up to the power voltage during the delay time D, and when it is disconnected from the power source, the voltage restarts to reduce due to the leak current of the pn junction 511. The above operations are repeated to continue an oscillating operation. This oscillation cycle is roughly determined by the time of the voltage at the first terminal 515 reducing from the power voltage to the voltage detection level. Therefore, the cycle becomes shorter at a high temperature at which the reverse leak current of the pn junction 511 increases, and becomes long at a low temperature at which the leak current reduces.

(Second Prior Art)

Japanese Patent Laid-open Publication No. SHO 61-50287, Japanese Patent Laid-Open Publication No. SHO 61-139995, Japanese Patent Laid-Open Publication No. SHO 61-214297 and Japanese Patent Laid-Open Publication No. SHO 62-40694 teach to use transistors and capacitors of memory cells to monitor the leak current of the memory cells. As a representative example, the construction disclosed in the Japanese Patent Laid-Open Publication No. SHO 61-50287 will be described with reference to FIG. 12 and FIGS. 13A, 13B, 13C and 13D.

In a dynamic memory including an automatic refresh control circuit shown in FIG. 12, memory cells are each constituted of one storage retaining capacitor and one transfer gate which are connected in series with each other. A leak monitor circuit 610 has the same construction as that of the memory cell, and one transfer gate Q and one capacitor C are connected in series with each other between a power source $V_{DD}$ and a specified potential terminal (ground terminal). A CMOS inverter 611 connected with the leak monitor circuit 610 is supplied with a voltage retained in the capacitor C. In the CMOS inverter 611, a p-channel MOS transistor $Q_P$ is formed to have a greater transconductance than that of an n-channel MOS transistor $Q_N$. With this arrangement, a threshold voltage $V_{TH}$ is set to be higher than ½ $V_{DD}$ ($V_{DD}$ is the operating power voltage) by a specified value. A first control circuit 613 shapes the waveform of output of the CMOS inverter 611. A self-excited type oscillator 614 enters into an oscillation mode upon receiving the output of the first control circuit 613 to execute an oscillating operation. A refresh address counter 615 resets itself upon receiving the output of the first control circuit 613 and forms a refresh address through counting of outputs from the oscillator 614. This address counter 615 sends a refresh address to a row decoder for selectively driving a word line of the memory cell array. A second control circuit 616 generates a pulse of a constant width upon receiving an overflow output from the refresh address counter 615 to turn on the transfer gate Q of the leak monitor circuit 610 by means of this pulse to thereby charge the capacitor C.

Next, the operation of the automatic refresh control circuit will be described with reference to FIGS. 13A through 13D. First, the transfer gate Q of the leak monitor circuit 610 keeps its on state from a time $t_1$ to a time $t_2$ by an output $P_2$ of the second control circuit 616, whereby the capacitor C is charged and a value of 1 is written into a storage node N between the transfer gate Q and the capacitor C. The potential of this node N can be regarded as a representative leak state of the memory cells. That is, when the leak current of the memory cells is large, the potential of the node N speedily becomes zero volts. When the leak current is smaller, it takes a longer time for the potential at the node N to reach the zero volts. At a time point $t_3$ when the potential at the node N becomes below the threshold voltage $V_{TH}$ of the CMOS inverter 611, the inverter output potential changes from the 0-level to the 1-level, and this output is subjected to waveform shaping in the first control circuit 613. Output of the first control circuit 613 resets the refresh address counter 615 and brings the oscillator 614 into the oscillation mode. As a result, the output of the oscillator 614 oscillates, and the counter 615 counts oscillations to form a refresh address. When the counter 615 makes a round of counting operation and an overflow occurs in the counter at a time $t_4$, the overflow output signal is supplied to the second control circuit 616, and the leak monitor circuit 610 is driven again by the pulse generated in the second control circuit 616, thereby recharging the capacitor C.

According to the first prior art shown in FIG. 9, the leak current of the pn junction having a temperature-leak characteristic similar to that of memory cells is monitored in order to monitor the leak current of the memory cells. However, since the leak current of the pn junction is normally very small, a very large pn junction region has been required so as to obtain a leak current sufficient to be monitored. This has consequently led to the disadvantage that the chip size increases by the increased area of the pn junction region.

On the other hand, the second prior art utilizes the memory cell transistors and capacitors to monitor the leak current of the memory cells. However, the leak of the capacitors normally occurs due to the defect of the pn junction portion or the insulating film. Therefor, the leak current differs significantly among the capacitors. This disadvantageously makes it difficult to adjust the refresh cycle to an appropriate value. Furthermore, since the leak current of a capacitor is normally very small, in order to monitor the leak current well, it is required that each capacitor has a very large size such that a sufficient leak current is generated. The requirement disadvantageously invites the increase of the chip size.

SUMMARY OF THE INVENTION

An object of the present invention is therefore to provide a semiconductor storage device capable of optimally setting the refresh cycle for the memory cells by accurately detecting the leak current of the memory cells without causing an increase in chip size.

In order to accomplish the above object, a semiconductor storage device having a self-refresh function according to an aspect of the present invention comprises a plurality of memory cells each constructed of a transistor and a capacitor, a plurality of bit lines connected with the memory cells arranged in columns, a bit line pre-charge potential line for applying a pre-charge potential to the bit lines, a bit line pre-charge potential generator for retaining the pre-charge potential on the bit line pre-charge potential line, a refresh timer circuit for generating a clock signal in a specified refresh cycle in a self-refresh mode of the device, a leak-monitoring capacitor connected with the bit line pre-charge potential generator, charging means for charging one end of the leak-monitoring capacitor with a first potential, and discharging means for discharging from the leak-monitoring capacitor an amount of electric charges corresponding to a leak occurring at the bit line pre-charge potential line, wherein the refresh timer circuit generates a clock signal in a cycle corresponding to a time in which the first potential at the one end of the leak-monitoring capacitor lowers to a second potential.

According to this construction, the leak of the electric charges accumulated in the memory cell capacitors is indirectly measured by measuring the leak generated at the bit line pre-charge potential line. Here, because the discharging means discharge the leak-monitoring capacitor of an amount of electric charges corresponding the leak generated at the bit line pre-charge potential line, the leak of the electric charges accumulated in the memory cell capacitors is monitored indirectly by monitoring the potential of the leak-monitoring capacitor.

When the indirectly measured amount of leak reaches a specified value, the potential of the one end of the leak-monitoring capacitor has lowered to the second potential. The refresh timer circuit generates a clock signal in a cycle corresponding to the time in which the potential of the first capacitor reduces from the first potential to the second potential, thereby refresh the memory cells.

The bit line pre-charge potential line is connected to the bit lines, and the bit lines are normally connected to pn junctions. Therefore, according to this invention, the leak current of the pn junctions having a temperature characteristic similar to that of the leak of the memory cells is measured. Accordingly the leak current of the memory cells is accurately detected. Furthermore, according to this invention, the leak of the memory cells is indirectly measured or monitored by utilizing the existing bit lines and bit line pre-charge potential line. Therefore, the increase in chip size can be suppressed.

As is obvious, according to this invention, the refresh cycle for the memory cells is able to be optimally set according to the leak state of the accumulated electric charges of the memory cell capacitors through the accurate detection of the leak current of the memory cells and without the increase of the chip size.

In general, the leak current of a pn junction is normally generated due to the crystal defect or the like of the pn junction, and the leak current varies significantly among pn junctions. Therefore, the variation is significant especially when there is only a small number of pn junctions which serve as leak current sources. However, according to the semiconductor storage device of the present invention, the leak generated at the bit line pre-charge potential line is monitored. This implies that a great many leak current sources exist. Therefore, a leak current which is sufficiently averaged and free from the influence of the variation is monitored.

Quantitatively explaining using a concrete example, because the leak current becomes about one-half every time the ambient temperature drops by 10° C., the leak current at an ambient temperature of 30° C. becomes $½^4$ of the leak current at an ambient temperature of 70° C. Therefore, according to the present invention, a current for retaining the data can be reduced to about $½^4$ of that in the case where the refresh cycle is fixed supposing the leak current at the ambient temperature of 70° C.

In another aspect of the present invention, the leak in a semiconductor substrate is utilized to monitor the leak from the memory cells. This is because the leak of the semiconductor substrate is proportional to the leak of the memory cells and also there are leak sources covering the whole semiconductor substrate.

In order to carry out the method of monitoring the leak current in the semiconductor substrate, the present invention provides a dynamic type semiconductor storage device having a refresh function, comprising back bias voltage generator for detecting a potential of a semiconductor substrate to supply the semiconductor substrate with specified electric charges in a specified cycle when the potential of the semiconductor substrate falls out of a specified range, thereby putting the potential of the semiconductor substrate back into the specified range, and a refresh timer circuit for outputting a refresh clock signal to refresh memory cells in a cycle corresponding to a cycle of increase and decrease in the potential of the semiconductor substrate.

According to this construction, when the potential of the semiconductor substrate is increased by the leak from this substrate and consequently falls out of the specified range, the back bias voltage generator detects the potential and supplies the semiconductor substrate with electric charges in a specified cycle, thereby putting the substrate potential back into the specified range. Then, the refresh timer circuit outputs a refresh clock signal to refresh the memory cells in a cycle corresponding to the cycle of the increase and decrease in the potential of the semiconductor substrate.

The greater the leak of the semiconductor substrate is, the more frequently the refresh clock signal is output. In addition, the objective leak current source of the semiconductor substrate covers the whole chip. Therefore, in contrast to the case where local leak current sources having a significant variation between them are utilized, a sufficiently averaged leak current can be detected. As a result, the refresh cycle can be set optimally.

Furthermore, because the present invention utilizes the originally existing leak source as it is, the increase of the chip size is avoided.

Other objects, features, and advantages of the present invention will be apparent from the accompanying drawings and from the detailed description that follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below based on the embodiments thereof with reference to the accompanying drawings.

(First Embodiment)

Figure 1:
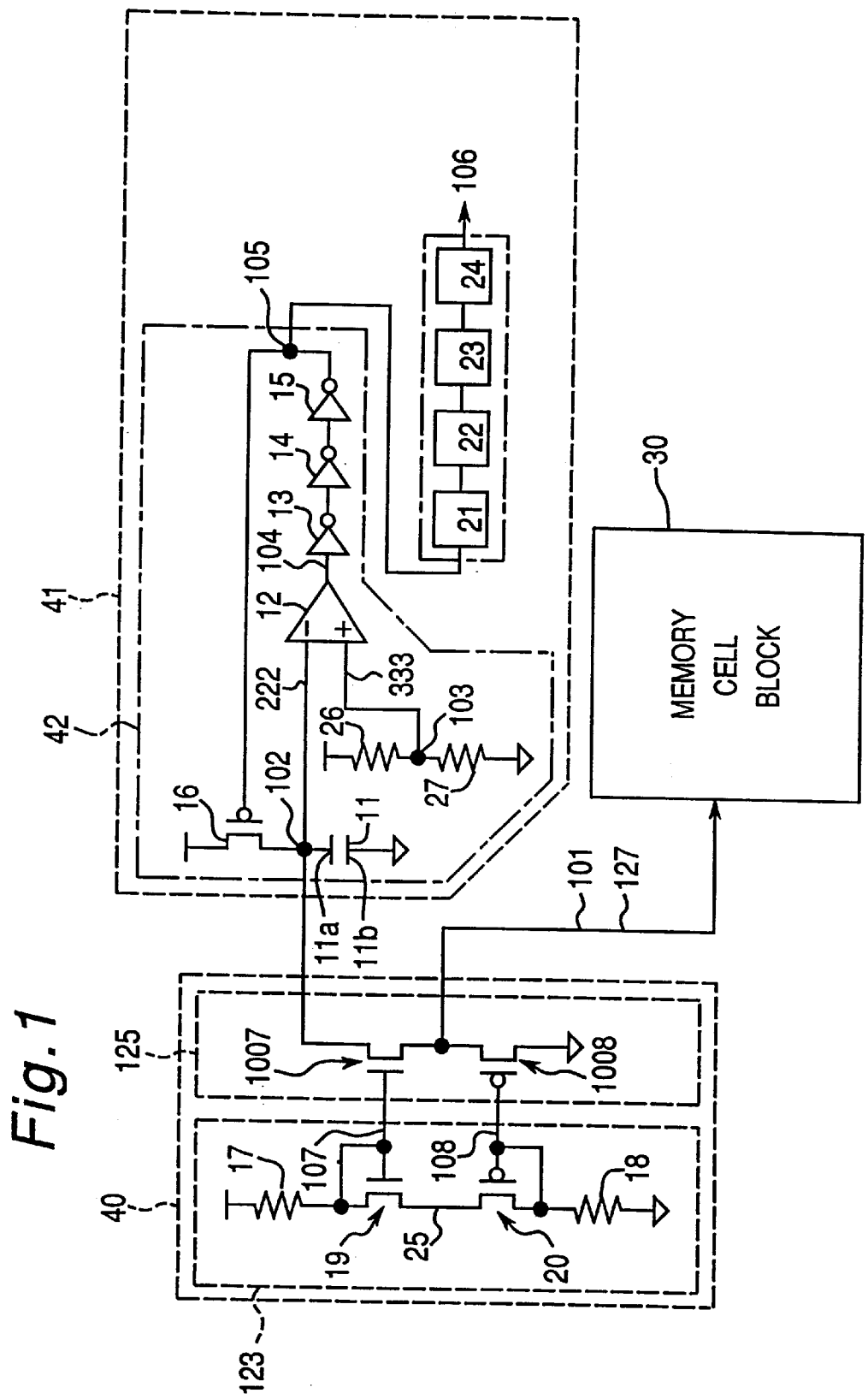
FIG. 1 is a circuit diagram of a first embodiment of the semiconductor storage device of the present invention.

FIG. 1 shows a first embodiment of the semiconductor storage device of the present invention. This first embodiment has a memory cell block 30, a bit line pre-charge potential generator 40 and a refresh timer circuit 41.

The bit line pre-charge potential generator 40 has transistors 19 and 20 and resistors 17 and 18, the resistor 17 being connected to a power source and the resistor 18 being connected to the ground. These resistors 17 and 18 and the transistors 19 and 20 constitute a reference potential generating section 123. The gate of the transistor 19 is connected to its source, and this source is connected to the resistor 17. The transistor 20 has its gate connected to its drain, and this drain is connected to the resistor 18. The drain of the transistor 19 is connected to the source of the transistor 20. Further, the gate of the transistor 19 is connected to the gate of a pull-up transistor 1007, and the gate of the transistor 20 is connected to the gate of a pull-down transistor 1008. The drain of the pull-up transistor 1007 is connected to the source of the pull-down transistor 1008. A node, or connection point, between the pull-up transistor 1007 and the pull-down transistor 1008 is connected to a bit line pre-charge potential line 101 of the memory cell block 30. The pull-up transistor 1007 and the pull-down transistor 1008 constitute a bit line pre-charge potential output section 125.

The pull-up transistor 1007 has its source connected to one end 11a of a leak-monitoring capacitor (referred as simply "capacitor" below) 11 in the refresh timer circuit 41. The other end 11b of the capacitor 11 is connected to the ground. A pre-charge transistor 16 is also connected to the one end 11a of the capacitor 11, and this pre-charge transistor 16 has its source connected to the power source. A node 102 between the pre-charge transistor 16 and the capacitor 11 is connected to the negative (−) terminal of a differential amplifier 12. This differential amplifier 12 has its positive (+) terminal connected to a node 103 between resistors 26 and 27. The resistor 26 is connected to the power source, while the resistor 27 is connected to the ground.

The differential amplifier 12 has its output terminal 104 connected to the input of an inverter array consisting of three inverters 13, 14 and 15 connected in series, and the inverter 15 has its output terminal 105 connected to the gate of the pre-charge transistor 16. The capacitor 11, the pre-charge transistor 16, the resistors 26 and 27, the differential amplifier 12 and the inverters 13–15 constitute a ring oscillator 42. Further, the output terminal 105 is connected to the input of four binary counters 21, 22, 23 and 24 connected in series with one another, and the binary counter 24 outputs a refresh clock signal 106.

Figure 3:
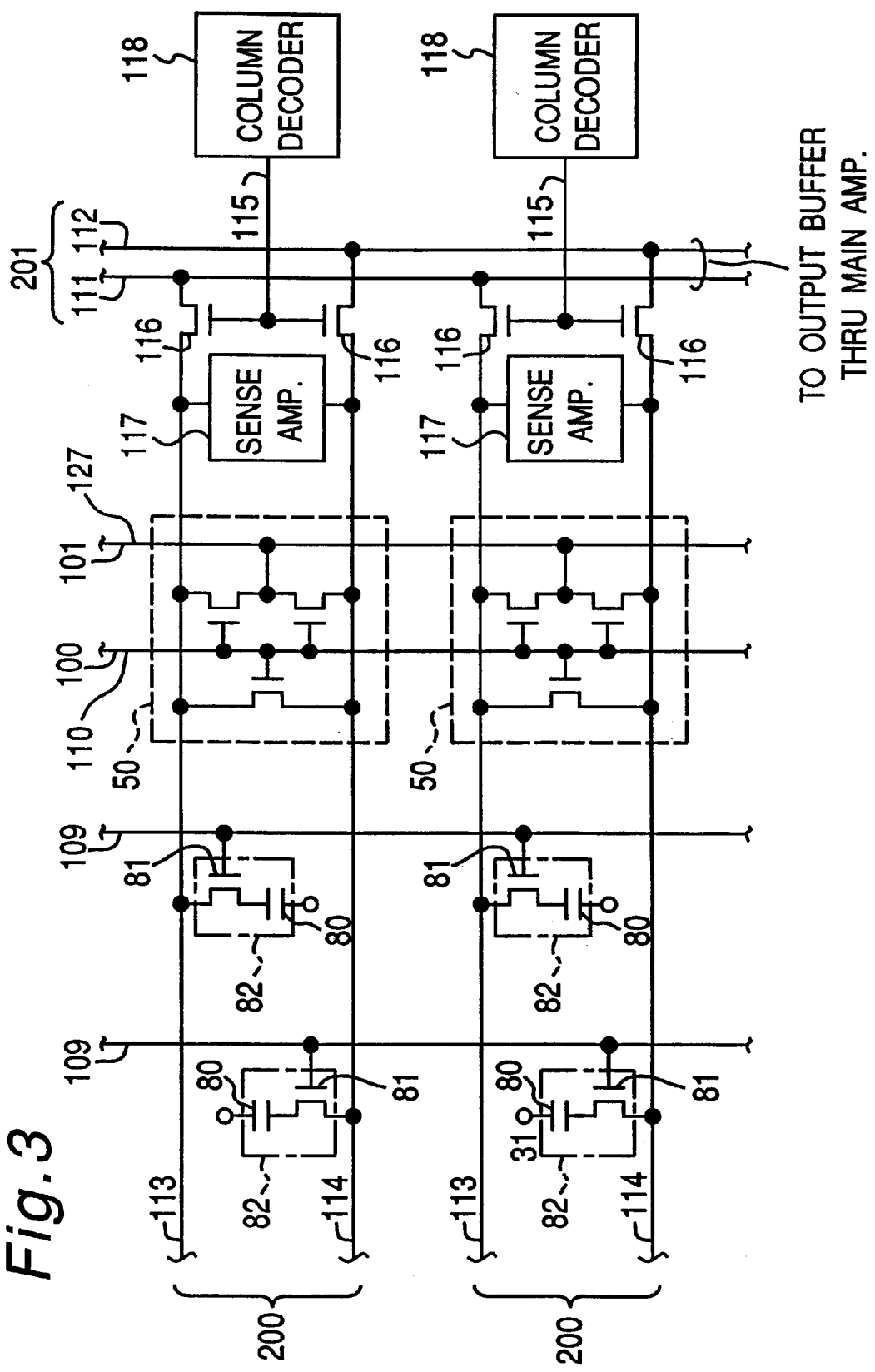
FIG. 3 is a circuit diagram showing memory cells, bit lines and bit line pre-charging circuits in the first embodiment.

On the other hand, the memory cell block 30 has a plurality of memory cells 82 (only four memory cells are shown in FIG. 3) each constructed of a capacitor 80 and a transistor 81. The memory cells 82 are arranged in a matrix form. Reference numeral 31 denotes a memory cell plate potential. The memory cells 82 in rows are connected to respective word lines 109 (only two word lines are shown), while the memory cells 82 in columns are connected with respective bit line pairs 200 (only two pairs are shown). The bit line pairs 200 are each comprised of bit lines 113 and 114. The bit line pairs 200 are connected with a plurality of bit line pre-charge circuits 50, respectively, and the bit line pre-charge circuits 50 are connected with a bit line pre-charge signal line 100 and a bit line pre-charge potential line 101. To each bit line pair 200 is connected a sense amplifier 117 adjacent to each bit line pre-charge circuit 50. Adjacent to this sense amplifier 117, the bit lines 113 and 114 in each pair are connected with data lines 111 and 112, respectively, through respective transfer gates 116 and 116. The data lines 111 and 112 constitute a data line pair 201. The transfer gates 116 have their gates connected to a column decoder 118. This column decoder 118 outputs a column decode signal 115 to the gates of the transfer gates 116 and 116.

Figure 4:
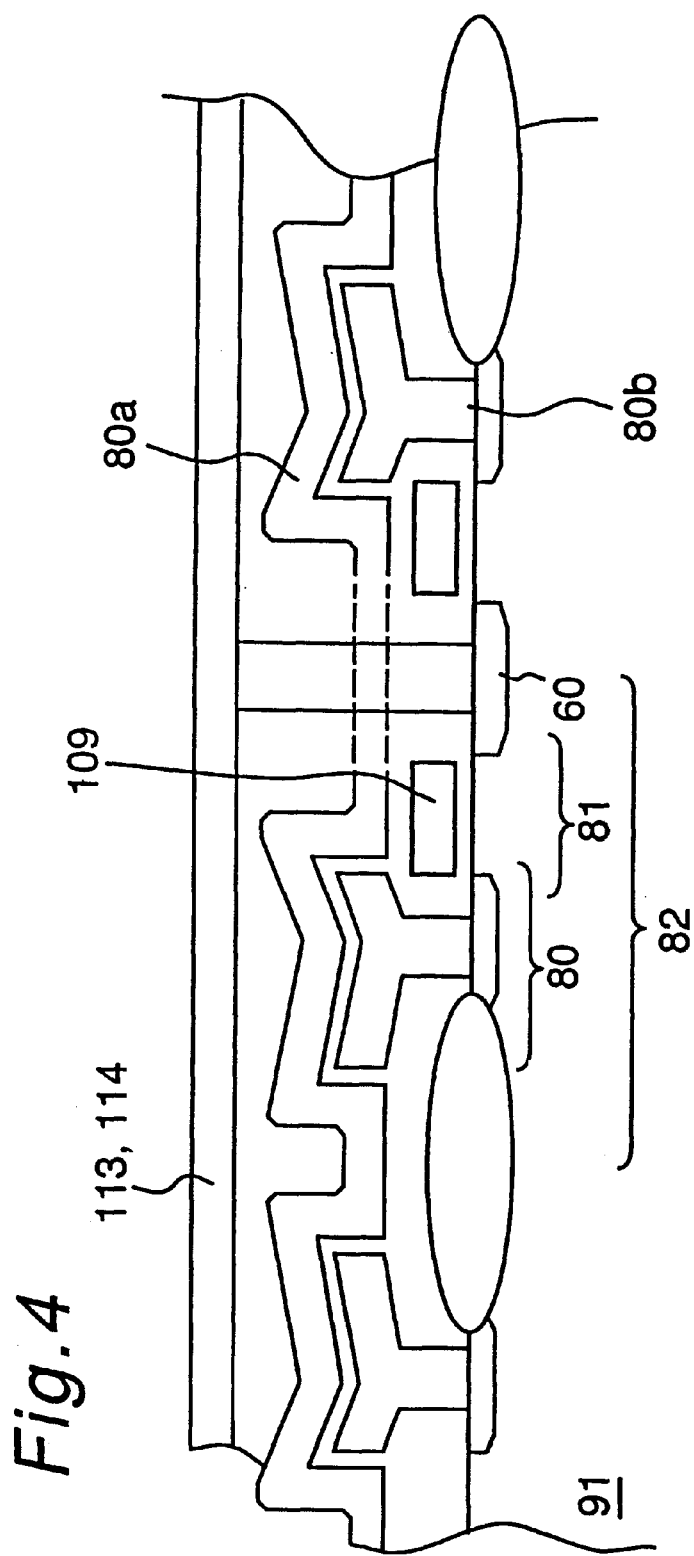
FIG. 4 is a sectional view of a memory cell owned by the first embodiment.

FIG. 4 shows a sectional view of the memory cell 82. The transistor 81 of the memory cell 82 is connected to the bit line 113 (or 114) via a diffusion contact 60 of a substrate 91.

Prior to an operation of reading the memory cell 82, the bit line pre-charge circuit 50 pre-charges the bit lines 113 and 114 with a bit line pre-charge potential. More specifically, when the signal on the bit line pre-charge signal 110 comes to have a high-level, the bit lines 113 and 114 are pre-charged by being short-circuited to the bit line pre-charge potential line 101. After the pre-charging is completed, the word line 109 makes a transition from a low-level to a high-level, then the memory cell transistor 81 becomes conductive, and the accumulated electric charges in the capacitor 80 are read out to the bit line 113 or 114.

Subsequently, the sense amplifier 117 amplifies a potential difference between the bit lines 113 and 114 and further makes the potentials of the bit lines 113 and 114 have the high-level and the low-level, or the low-level and the high-level, respectively, so that the electric charges are rewritten into the capacitor 80 of the memory cell 82.

The column decoder 118 selectively outputs the column decode signal 115 and connects the bit lines 113 and 114 to be selected to the data lines 111 and 112 via the transfer gate 116. A potential difference corresponding to the potential difference between the bit lines 113 and 114 is generated between the data lines 111 and 112. The potential difference between the data line pair is amplified by a main amplifier (not shown) and the result is transferred to an output buffer (not shown).

On the other hand, the bit line pre-charge potential generator 40 shown in FIG. 1 generates reference potentials 107 and 108 for generating a bit line pre-charge potential.

The thresholds of the transistors 19 and 20 have approximately equal absolute values, and the resistance values of the resistors 17 and 18 are set equal to each other. Therefore, the potential at a node 25 between the transistors 19 and 20 becomes approximately ½ Vcc. Therefore, the reference potential 107 becomes approximately (½ Vcc+Vtn), while the reference potential 108 becomes approximately (½ Vcc+Vtp), where Vtn and Vtp are the threshold values of the transistors 19 and 20, respectively, and Vtp is a negative value. Therefore, when a potential 127 of the bit line pre-charge potential line 101 becomes lower than ½ Vcc, the pull-up transistor 1007 becomes conductive. When the potential 127 of the bit line pre-charge potential line 101 becomes higher than ½ Vcc, the pull-down transistor 1008 becomes conductive. Thus, the bit line pre-charge potential generator 40 retains the bit line pre-charge potential 127 at approximately ½ Vcc.

Figure 2:
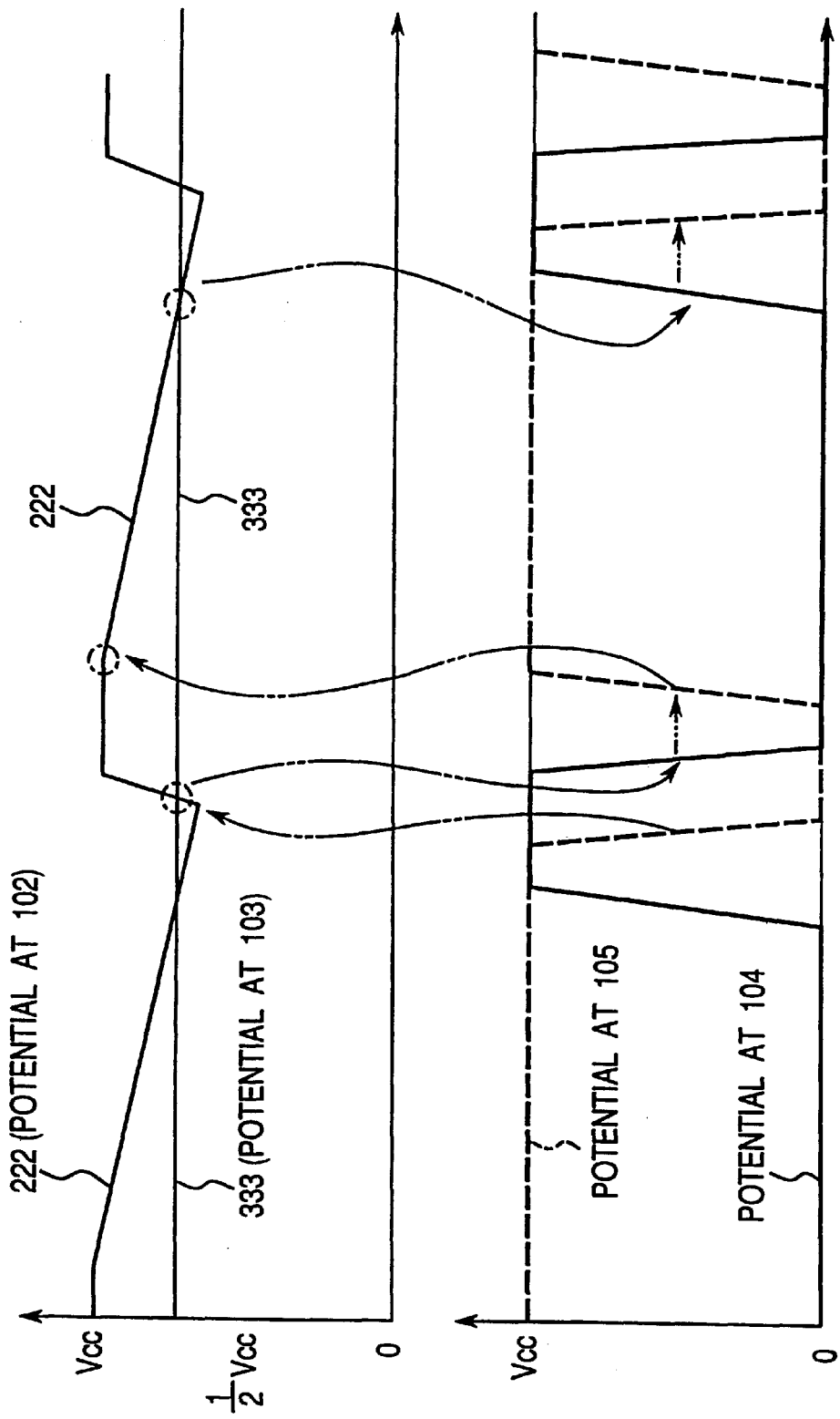
FIG. 2 is a timing chart for explaining the operation of the first embodiment.

On the other hand, the refresh timer circuit 41 shown in FIG. 1 generates an intermediate reference potential 333 between Vcc and ½ Vcc at the node 103 between the resistors 26 and 27. The operation of the refresh timer circuit 41 is now described with reference to FIG. 2. When the point 105 becomes a low-level, the pre-charge transistor 16 becomes conductive, so that the capacitor 11 is charged with the power voltage Vcc. Then, the differential amplifier 12 compares a potential 222 at the node 102 with the reference potential 333 at the node 103 and outputs a low-level signal to its output 104. Therefore, the node 105 comes to have a high-level.

When the accumulated electric charges of the capacitor 11 reduce due to a leak current and the potential 222 of the node 102 becomes lower than the reference potential 333 of the node 103, the differential amplifier 12, which compares the potential 222 of the node 102 with the reference potential 333 of the node 103, outputs a high-level signal to its output 104. Therefore, the node 105 comes to have the low-level, and the node 102 of the capacitor 11 is recharged with Vcc. In this way, the node 105 exhibits a repetitive change between the high-level and the low-level. Then, the binary counters 21 through 24 count the oscillations at the node 105 up to $2^4$ and output the refresh clock signal 106.

In this embodiment, the capacitor 11 of the refresh timer circuit 41 is connected to the source of the pull-up transistor 1007 of the bit line pre-charge potential output section 125 in the bit line pre-charge potential generator 40. Therefore, the leak current of the capacitor 11 is equal to a current consumed for pulling up the bit line pre-charge potential line 101 at the bit line pre-charge potential output section 125.

On the other hand, the bit line pre-charge potential line 101 is connected to the diffusion contact 60 shown in FIG. 4 via the bit line pre-charge circuit 50 and the bit lines 113 and 114 shown in FIG. 3. Since one diffusion contact 60 is provided for two memory cells 82, the semiconductor storage device totally has the diffusion contacts 60 to the number corresponding to one-half the number of bits of the memory capacity (i.e., there exist a great many diffusion contacts).

Therefore, the leak current of the capacitor 11 is equal to the leak current from the great many diffusion contacts 60.

Furthermore, the leak from the diffusion contacts 60 connected to the bit lines 113 and 114 is pn junction leak similar to the leak from the memory cells 82. Therefore, the leak from the diffusion contacts 60 and the leak from the memory cells 82 have the same temperature characteristics.

As is obvious, according to this embodiment, a leak from the diffusion contacts 60 occurs according to the leak state of the accumulated electric charges of the capacitors 81 of the memory cells 82, and the amount of leak from the diffusion contacts 60 is equal to the amount of electric discharge from the capacitor 11. The ring oscillator 42 oscillates at a frequency proportional to the rate of electric discharge from the capacitor 11, and for every $2^4$ counts of this oscillation by the binary counters 21–24, the refresh clock signal is output from the refresh timer circuit 41. That is, according to this embodiment, the refresh time is adjustable by the binary counters 21 through 24. It is proper to determine the number of the binary counters according to the number of memory cells (or the number of diffusion contacts).

According to this embodiment, the leak current of the memory cells 82 is accurately detected without causing an increase in chip size by utilizing the leak from the diffusion contacts 60, and the refresh cycle of the memory cells 82 is adjustable to an appropriate value by the refresh timer circuit 41.

According to the present embodiment, the diffusion contacts 60 of the bit lines are used as leak current sources to be monitored. Because the diffusion contacts 60 are numerous, the leak current sources to be monitored are also numerous. Therefore, a sufficiently large leak current flows from the leak current sources, thereby allowing the monitoring of the leak current to be easy.

Furthermore, the bit line diffusion contacts 60 serving as the monitored leak current sources originally exist in the existing semiconductor storage devices. That is, no such special leak current sources as those of the first and second prior arts is required. Therefore, the die size does not increase.

The leak current of a pn junction is normally generated due to the crystal defect or the like of the pn junction, and the leak current varies significantly between pn junctions. Therefore, the variation becomes significant when there is only a small number of pn junctions which serve as leak current sources. However, according to this embodiment, a great many leak current sources (diffusion contacts 60) are used. Therefore, a sufficiently averaged leak current is able to be monitored, so that the influence of the variation in the leak current between the pn junctions is eliminated.

(Second Embodiment)

Figure 5:
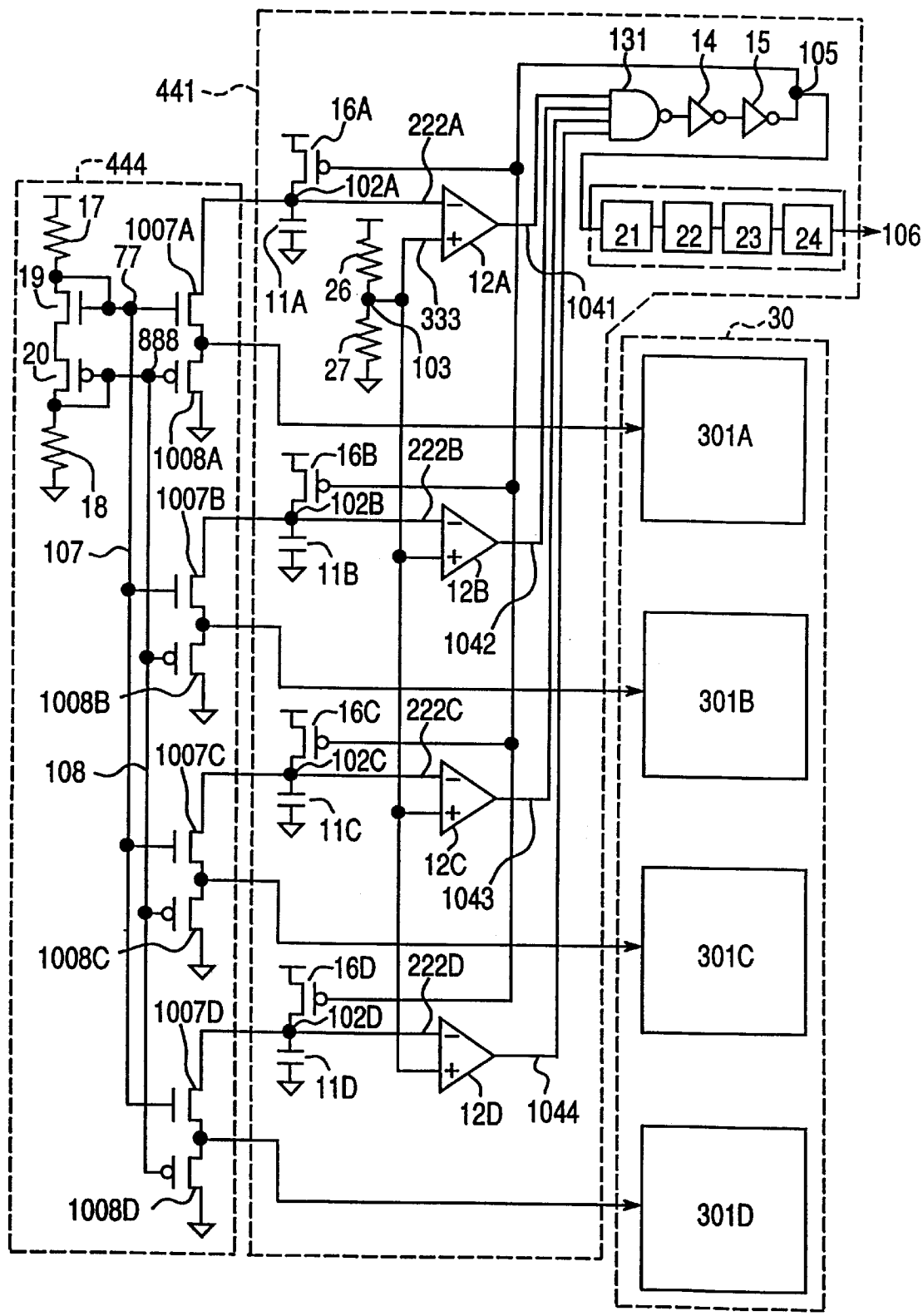
FIG. 5 is a circuit diagram of a second embodiment of the semiconductor storage device of the present invention.

Next, FIG. 5 shows a second embodiment of the present invention. This second embodiment differs from the aforementioned first embodiment mainly in that the memory cell block 30 shown in FIG. 1 is constructed of four sub-blocks 301A, 301B, 301C and 301D. Therefore, the components common to those of the first and second embodiments are denoted by the same reference numerals in FIG. 5 with the description thereof omitted, and the following description will be concentrated on the point different from the first embodiment.

In a bit line pre-charge potential generator 444, pull-up transistors 1007A, 1007B, 1007C and 1007D are connected in parallel with one another to a point 77 at which the reference potential 107 is generated. Further, pull-down transistors 1008A, 1008B, 1008C and 1008D are connected in parallel with one another to a point 888 at which the reference potential 108 is generated.

The sub-block 301A is connected to a connection line between the pull-up transistor 1007A and the pull-down transistor 1008A, while the sub-block 301B is connected to a connection line between the pull-up transistor 1007B and the pull-down transistor 1008B. The sub-block 301C is connected to a connection line between the pull-up transistor 1007C and the pull-down transistor 1008C, while the sub-block 301D is connected to a connection line between the pull-up transistor 1007D and the pull-down transistor 1008D.

The pull-up transistors 1007A, 1007B, 1007C and 1007D have their sources connected to nodes 102A, 102B, 102C and 102D between transistors 16A, 16B, 16C and 16D and leak-monitoring capacitors 11A, 11B, 11C and 11D, respectively, similar to the first embodiment shown in FIG. 1. The nodes 102A, 102B, 102C and 102D are in turn connected to the negative (−) terminals of differential amplifiers 12A, 12B, 12C and 12D, respectively. The positive (+) terminal of each of the differential amplifiers 12A, 12B, 12C and 12D is connected with the node 103 between the resistors 26 and 27. Further, output 1041, 1042, 1043, 1044 of each of the differential amplifiers 12A, 12B, 12C and 12D is connected with a NAND circuit 131. Output of the NAND circuit 131 is in turn connected to an inverter 14, and the inverter 14 is then connected to an inverter 15. Output of the inverter 15 is connected with both the transistors 16A, 16B, 16C and 16D and the binary counters 21 through 24.

In the semiconductor storage device of this second embodiment, output signals 1041, 1042, 1043 and 1044 of the four differential amplifiers 12A–12D are supplied to the NAND circuit 131. Therefore, an output signal of the NAND circuit 131 does not have a low-level until all the outputs 1041, 1042, 1043 and 1044 of the four differential amplifiers 12A–12D reaches a high-level. Therefore, the refresh timer circuit 441 does not execute a cycle of oscillating operation until the potentials 222A–222D at the nodes 102A–102D all become lower than the reference potential 333 of the node 103.

If a short-circuit occurs between the word line 109 and the bit lines 113 and 114 in one sub-block 301A, for example, and the potential at the node 102A at one end of the capacitor 11A decreases to become lower than the reference potential 333 due to the leak current attributed to the short-circuit, the oscillating operation by the refresh timer circuit 41 does not start until the other nodes 102B–102D at one end of the capacitors 11B–11D also have potentials lower than the reference potential 333, as stated above. In this second embodiment, the memory cell block 30 is divided into four sub-blocks 301A–301D. Therefore, even when there are three sub-blocks in which a short-circuit occurs and the potentials at one end of three of the capacitors 11A–11D rapidly reduce due to a leak current attributed to the short-circuit, the influence of the leak current attributed to the short-circuit is ignored.

The necessity of the above arrangement of the second embodiment will be described below. In a semiconductor fabricating process, a resistive short-circuit sometimes occurs due to dust or the like between a bit line and another line such as, for example, a word line. In this case, the word line has the GND potential, while the potential of the bit line is ½ Vcc. Therefore, a leak occurs from the bit line pre-charge potential line 101 to the GND via the resistive short-circuit. Such a leak current is normally larger than the leak current from the diffusion contact 60. In this regard, in the first embodiment, there is a possibility that, if a leak occurs even at a single location between the bit line 113 or 114 and the word line 109 on the semiconductor storage device, a leak current via the diffusion contact 60 becomes unable to be correctly monitored due to the leak current attributed to the short-circuit.

In contrast to this, according to the second embodiment, even if a short-circuit occurs between the bit line and another line, its influence is ignored when there are few short-circuited portions, therefore allowing the semiconductor storage devices to be provided with high yield.

(Third Embodiment)

Figure 6:
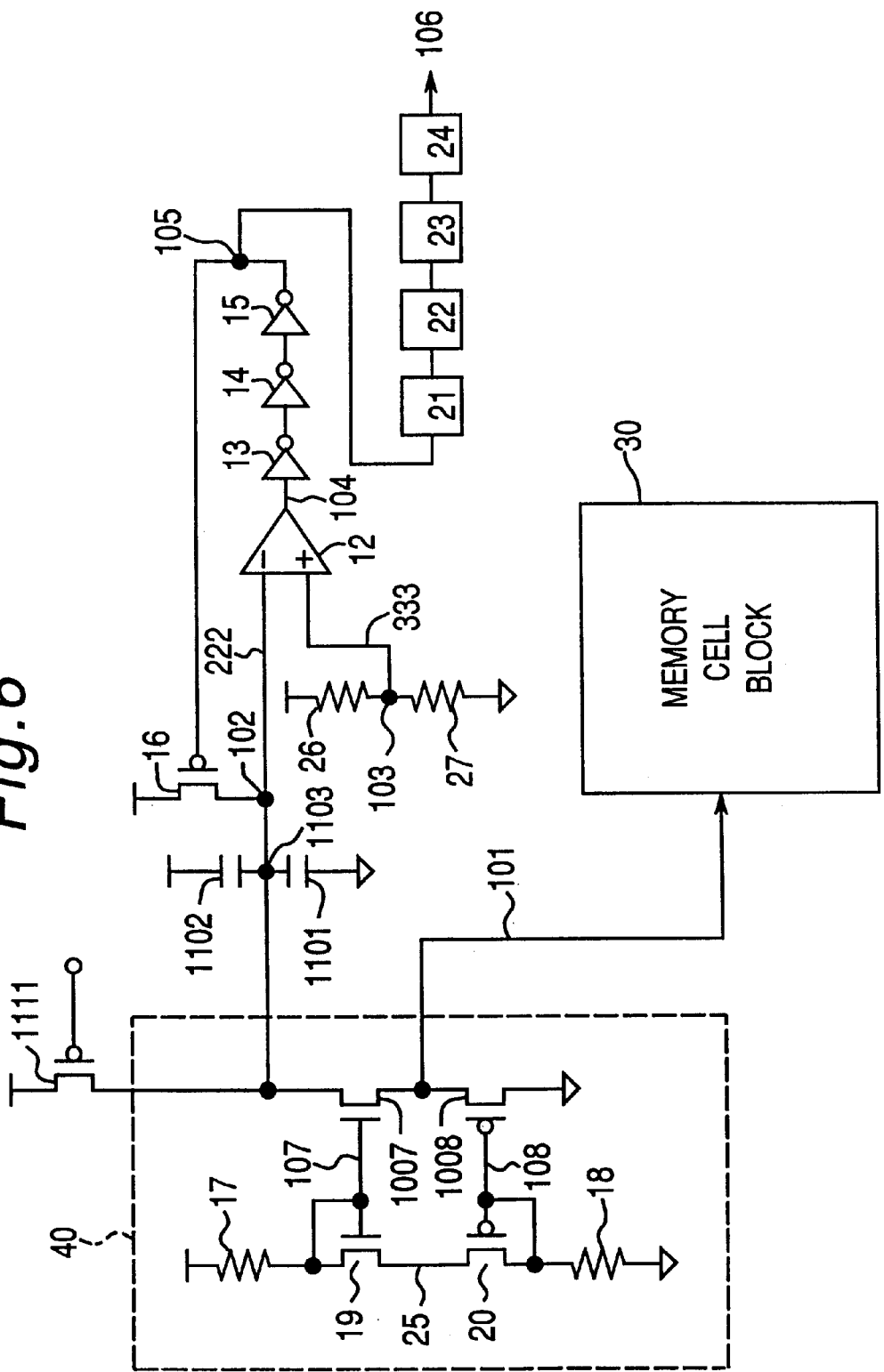
FIG. 6 is a circuit diagram of a third embodiment of the semiconductor storage device of the present invention.

Next, FIG. 6 shows a third embodiment of the present invention. This third embodiment differs from the aforementioned first embodiment only in the point that capacitors 1101 and 1102 are provided in place of the capacitor 11 of the first embodiment and the point that a pull-up transistor 1111 is connected to a node 1103 between the capacitors 1101 and 1102. Therefore, the following description is concentrated upon those different points.

The capacitors 1101 and 1102 are connected in series with each other, and the other end of the capacitor 1101 is connected to the ground. The other end of the capacitor 1102 is connected to the power source. A capacitance ratio between the capacitor 1101 and the capacitor 1102 is set equal to a resistance ratio between the resistor 26 and the resistor 27.

In this third embodiment, the pull-up transistor 1111 is connected to the node 1103 between the capacitors 1101 and 1102. To the gate of this pull-up transistor 1111 is supplied a high-level signal in the self-refresh mode, and a low-level signal in the other operation modes.

A first effect of the above construction will be described below. It is now assumed that the resistance ratio between the resistor 26 and the resistor 27 and the capacitance ratio between the capacitor 1102 and the capacitor 1101 are each set to 1:3. Then, the potential at a node 102 between the capacitors 1101, 1102 and a pre-charge transistor 16 is ¾ Vcc.

Now assume that the power voltage Vcc instantaneously has changed to Vcc'. Then, both the potential of the node 102 and the reference potential 333 of the differential amplifier 12 change to ¾ Vcc' since the capacitance ratio between the capacitors 1101 and 1102 is the same as the resistance ratio between the resistors 26 and 28. Therefore, according to the present embodiment, the potential 222 of the node 102 will be changed following the change in the reference potential 333 attributed to the change in power voltage. Therefore, the change in the power voltage can be prevented from affecting the detection of the leak current, thereby allowing the objective leak current to be correctly detected.

A second effect of the above construction will be described below. Immediately after the power is turned on, the bit line pre-charge potential is required to increase from the GND potential to ½ Vcc. However, since there exist a great many bit lines, the bit line pre-charge potential generator 40 must supply the bit line pre-charge potential line 101 with a large amount of electric charges. In this embodiment, the pull-up transistor 1111 is conductive in a mode other than the self-refresh mode so that the source of the pull-up transistor 1007 of the bit line pre-charge potential generator 40 is electrically connected to the power voltage Vcc via the pull-up transistor 1111. Therefore, the bit line pre-charge potential line 101 is supplied with a sufficient current immediately after the power is turned on.

(Fourth Embodiment)

Figure 7:
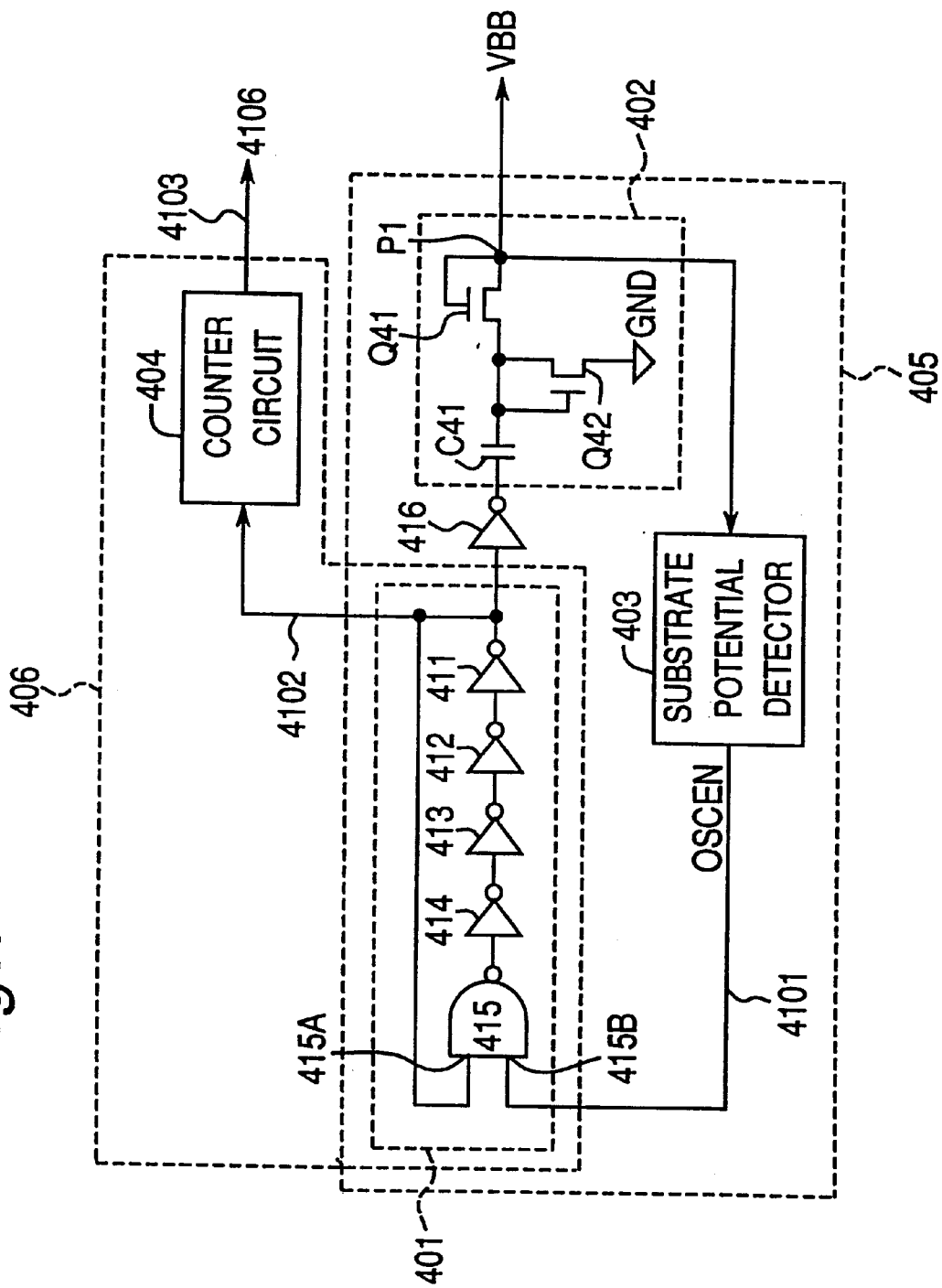
FIG. 7 is a circuit diagram of a fourth embodiment of the semiconductor storage device of the present invention.
Figure 8:
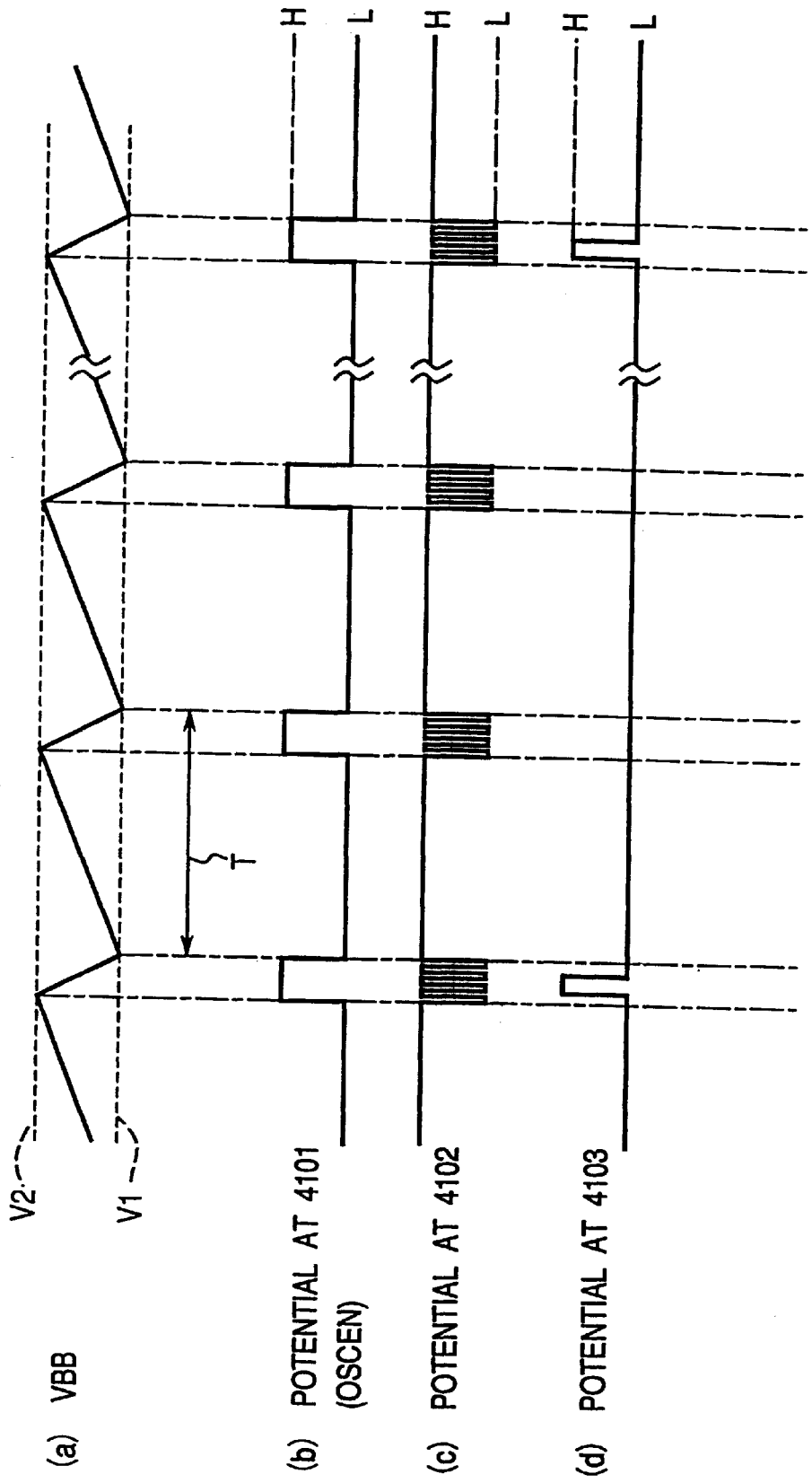
FIG. 8 is a timing chart for explaining the operation of the fourth embodiment.
Figure 9:
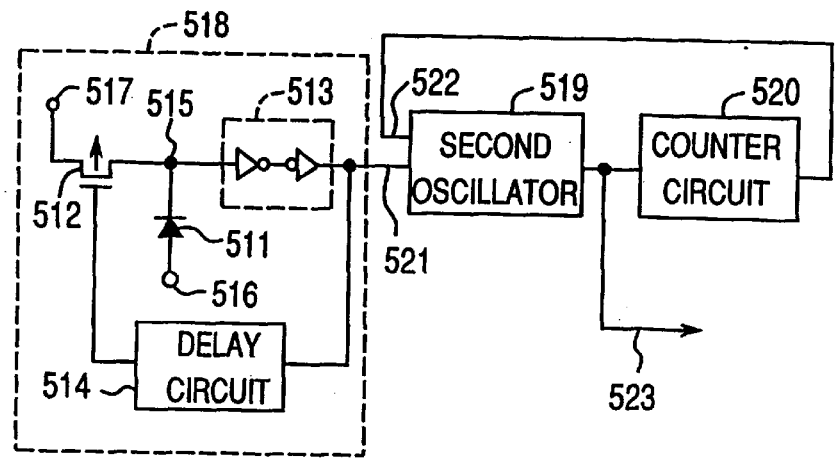
FIG. 9 is a circuit diagram of the first prior art.
Figure 10:
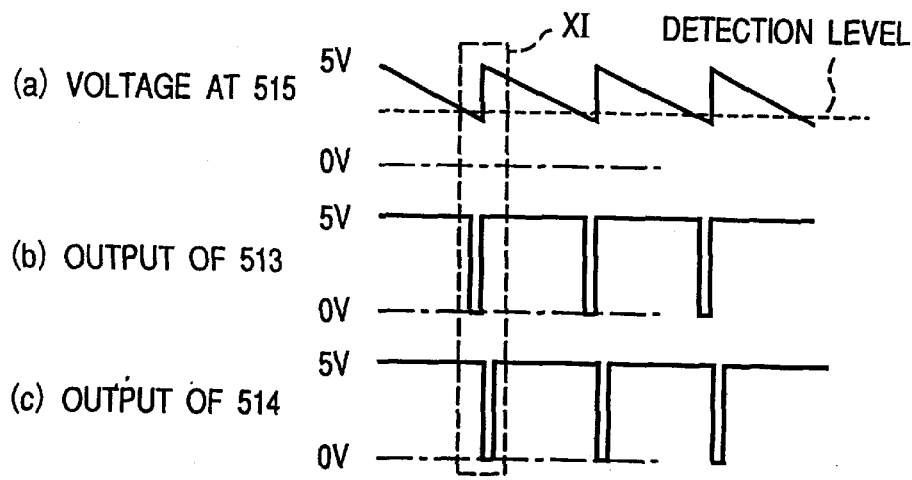
FIG. 10 is a chart of waveforms for explaining the operation of the first prior art.
Figure 11:
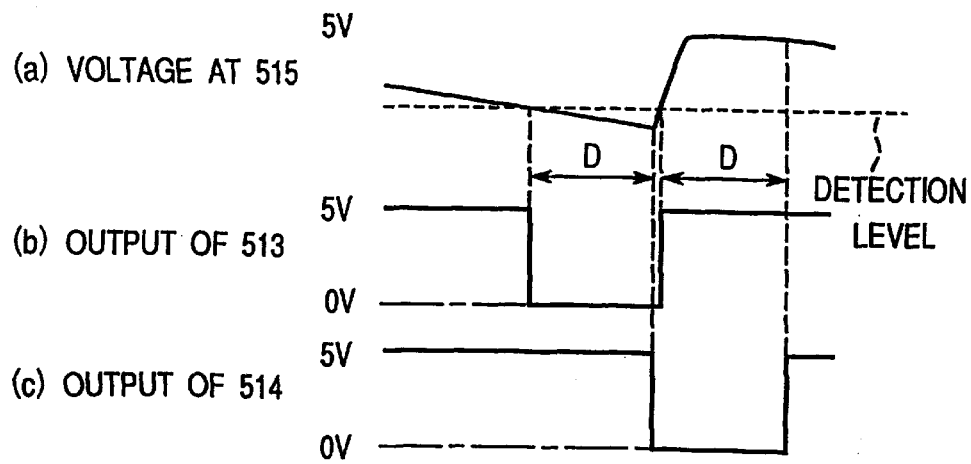
FIG. 11 is an enlarged view of a part XI of the above waveform chart.
Figure 12:
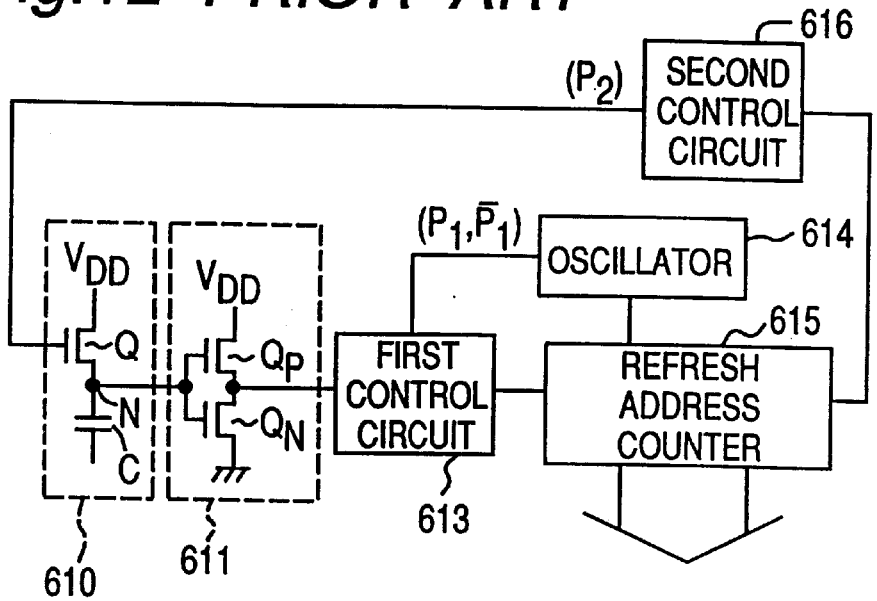
FIG. 12 is a circuit diagram of the second prior art.
Figure 13A:
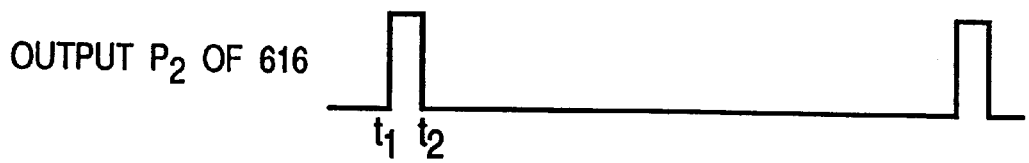
FIGS. 13A, 13B, 13C and 13D are charts of waveforms for explaining the operation of the second prior art.
Figure 13B:
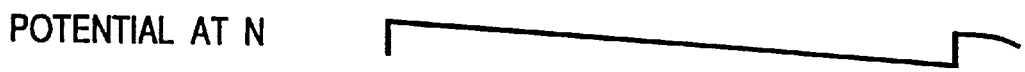
Figure 13C:
Figure 13D:

FIG. 7 shows a refresh timer circuit used in a fourth embodiment of the present invention, and FIG. 8 is a timing chart explaining the operation of the refresh timer circuit 406.

This fourth embodiment has a back bias generator 405 and a refresh timer circuit 406. The back bias generator 405 includes an oscillator 401, a charge pump circuit 402 and a substrate potential detector 403. The refresh timer circuit 406 includes the oscillator 401 and a counter circuit 404.

The oscillator 401 has a two-input NAND gate 415 and a plurality of inverters 414, 413, 412 and 411 connected in series with output of the NAND gate 415. An output signal of the final-stage inverter 411 is supplied to an input terminal 415A of the NAND gate 415. To the other input terminal 415B of the NAND gate 415 is supplied an output signal OSCEN of the substrate potential detector 403. An output signal of the NAND gate 415 is supplied to the input terminal of the first-stage inverter 414.

The charge pump circuit 402 has a capacitor C41 which is connected in series between an output terminal of an inverter 416 and a semiconductor substrate, an n-channel MOS transistor Q41 and an n-channel MOS transistor Q42.

The transistor Q41 is connected in series with the capacitor C41, and the transistor Q42 is connected to a node between the transistor Q41 and the capacitor C41. The transistor Q42 is grounded. The transistors Q41 and Q42 are each diode-connected. An output potential of the transistor Q41 is supplied to the semiconductor substrate as an output VBB of the back bias voltage generator 405.

An output signal of the inverter 411 of the oscillator 401 is input to the inverter 416 as an output signal of the oscillator 401. Then, the inverter 416 inverts and shapes the waveform of the output signal of the oscillator 401 and supplies the same to the charge pump circuit 402.

The substrate potential detector 403 is connected, at its input side, with an output point P1 of the transistor Q41 of the charge pump circuit 402 and detects the potential at this output point P1 as the substrate potential VBB. When the potential VBB of the semiconductor substrate is lower than a first potential V1, the substrate potential detector 403 outputs a low-level detection signal L to the oscillator 401 until the substrate potential VBB becomes higher than a second potential V2 which is higher than the first potential V1.

When the potential VBB of the substrate is higher than the second potential V2, the substrate potential detector 403 outputs a high-level detection signal H to the oscillator 401 until the substrate potential VBB becomes lower than the first potential V1.

Then, the oscillator 401 supplies an output pulse to the counter circuit 404 via an output node 4102. The counter circuit 404 counts the supplied pulses and, every time the pulse count reaches a specified value, the counter circuit 104 outputs a refresh clock signal 4106 to an output node 4103.

The operation of the circuit will be described with reference to FIG. 8.

When the output signal OSCEN of the substrate potential detector 403 has a low level L, the output potential of the NAND gate 415 has a high level regardless of the output potential of the inverter 411. Therefore, during a period in which the output signal OSCEN is fixed to the low level, this oscillator 401 does not oscillate, and the output node 4102 is fixed to the high level.

When the output signal OSCEN has the high level, the NAND gate 415 operates as an inverter. Therefore, during a period in which the output signal OSCEN has the high level, the oscillator 401 constitutes a ring oscillator, and the signal of the output node 4102 oscillates in a cycle corresponding to a signal delay time of the inverters 411, 412, 413 and 414 and the NAND gate 415 as an inverter.

As described above, the oscillator 401 executes the oscillating operation only in the period in which the output signal OSCEN of the substrate potential detector 403 has a high level and does not perform the oscillating operation in the period in which the output signal OSCEN has a low level.

That is, the oscillator 401 performs the oscillating operation only from the time when the semiconductor substrate potential VBB exceeds the value of the second potential V2 to the time when the potential VBB is reduced by the charge pump 402 to become lower than the first potential V1.

Then, after counting a specified number of output pulses coming from the oscillator 401, the counter circuit 404 supplies the refresh clock signal 4106 to the output node 4103.

Normally, in DRAMs (Dynamic Random Access Memories), only one row is selected at one time within an identical memory block. Therefore, in this semiconductor storage device, the refresh operation is executed row by row every time the counter circuit 404 outputs the refresh clock signal.

The operation of the charge pump circuit 402 will be described next.

When the potential VBB of the semiconductor substrate becomes higher than the second potential V2, the output signal OSCEN comes to have a high level, and the charge pump circuit 402 supplies the semiconductor substrate with a specified amount of negative electric charges in a specified cycle. Therefore, the potential VBB of the semiconductor substrate gradually approaches the first potential V1 while repeating fall and rise in the specified cycle.

When the potential of the semiconductor substrate becomes lower than the first potential V1, the charge pump circuit 402 stops operating, so that the semiconductor substrate is supplied with no negative electric charges from the charge pump circuit 402. Consequently, the substrate potential VBB monotonously rises as time elapses until it exceeds the specified potential V2 due to the leak of the semiconductor substrate.

Thereafter, when the potential VBB of the semiconductor substrate becomes higher than the second potential V2 again, the charge pump 402 starts operating to supply the semiconductor substrate with negative electric charges. Then, the potential VBB of the semiconductor substrate reduces.

By repeating the above operations, the potential VBB of the semiconductor substrate is maintained approximately within a potential range of from the first potential V1 to the second potential V2. A period T of the rise and fall of the potential VBB of the semiconductor substrate is approximately in inverse proportion to the magnitude of the leak current of the semiconductor substrate.

The refresh operation by the refresh timer circuit 406 will be described next.

To retain data in memory cells so that they do not disappear, it is required that the memory cells should be refreshed by the time when the leak charge amount of the memory cells reaches a specified value.

The leak current of the memory cells increases or decreases according to the magnitude of the leak current of the semiconductor substrate. Then the leak charge amount of the semiconductor substrate is proportional to the number of pulses output from the oscillator 401 to the output node 4102. Therefore, the amount of the memory cell leak electric charges is proportional to the number of pulses output from the oscillator 401.

Therefore, by refreshing the memory cells by means of the refresh clock signal 4106 output from the counter circuit 404 when the number of pulses output from the oscillator 401 to the output node 4102 reaches a specified value, the memory cells are refreshed before the memory cell leak charge amount reaches the specified value, thereby allowing the data in the memory cells to be retained.

According to this fourth embodiment, the leak of the memory cells is monitored by utilizing the leak current of the semiconductor substrate, which implies that the memory cell leak current is detected without causing an increase in chip size. Furthermore, the refresh cycle, or period of the cyclic refresh operations is able to be set to an appropriate value by the refresh timer circuit 406.

Furthermore, the objective leak current source of the semiconductor substrate for the detection of the leak current covers the whole chip. Therefore, according to this fourth embodiment, a sufficiently averaged leak current from the memory cells can be detected in contrast to the case where local leak current sources having a significant variation of leak current is utilized. Therefore, according to this embodiment, the refresh cycle can be more accurately set.

Furthermore, in this fourth embodiment, the oscillator 401 is common to the back bias generator 405 and the refresh timer circuit 406. Therefore the circuit scale can be reduced.

A NOR gate may be used in place of the NAND gate 415 in the oscillator 401.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device having a self-refresh function, comprising:
   a plurality of memory cells each constructed of a transistor and a capacitor;
   a plurality of bit lines connected with the memory cells arranged in columns;
   a bit line pre-charge potential line for applying a pre-charge potential to said bit lines;
   a bit line pre-charge potential generator for retaining the pre-charge potential on said bit line pre-charge potential line;
   a refresh timer circuit for generating a clock signal in a specified refresh cycle in a self-refresh mode of said device;
   a leak-monitoring capacitor connected with said bit line pre-charge potential generator;
   charging means for charging one end of said leak-monitoring capacitor with a first potential; and
   discharging means for discharging from said leak-monitoring capacitor an amount of electric charges corresponding to a leak occurring at said bit line pre-charge potential line, wherein
   said refresh timer circuit generates a clock signal in a cycle corresponding to a time in which said first potential at the one end of said leak-monitoring capacitor lowers to a second potential.

2. The semiconductor storage device as claimed in claim 1, wherein
   said bit line pre-charge potential generator includes said discharging means.

3. The semiconductor storage device as claimed in claim 1, wherein
said discharging means discharges said amount of electric charges to said bit line pre-charge potential line.

4. The semiconductor storage device as claimed in claim 3, wherein
said discharging means comprises a pull-up transistor whose source and drain are connected with said leak-monitoring capacitor and said bit line pre-charge potential line, respectively.

5. The semiconductor storage device as claimed in claim 1, wherein
said charging means recharges said one end of said leak-monitoring capacitor upon receipt of a signal output from said refresh timer circuit when said first potential at the one end of said leak-monitoring capacitor has lowered to said second potential.

6. The semiconductor storage device as claimed in claim 1, wherein
said first potential is a power source potential.

7. The semiconductor storage device as claimed in claim 1, wherein
said pre-charge potential for the bit lines is half a power source potential.

8. The semiconductor storage device as claimed in claim 1, wherein
said refresh timer circuit comprises a ring oscillator.

9. The semiconductor storage device as claimed in claim 8, further comprising:
capacitor potential detecting means for detecting whether a potential at said one end of said leak-monitoring capacitor is higher or lower than said second potential.

10. The semiconductor storage device as claimed in claim 9, wherein
said ring oscillator executes one cycle of oscillation using as a trigger an event that said capacitor potential detecting means has detected the potential at said one end of said leak-monitoring capacitor having become lower than said second potential.

11. The semiconductor storage device as claimed in claim 1, wherein
said memory cells are divided into a plurality of sub-blocks;
said bit line pre-charge potential line includes a plurality of bit line pre-charge potential lines for the respective sub-blocks;
said leak-monitoring capacitor includes a plurality of capacitors corresponding to said plurality of bit line pre-charge potential lines, wherein these capacitors are discharged of the electric charges independently of each other by said discharging means; and
said refresh timer circuit generates a clock signal in a cycle corresponding to a time in which potentials of the one end of said plurality of capacitors all reduce from said first potential to said second potential.

12. The semiconductor storage device as claimed in claim 1, further comprising:
reference potential generating means for generating said second potential; and
potential increasing and decreasing means for, when said second potential generated by said reference potential generating means is increased or decreased due to a fluctuation in power voltage, increasing or decreasing the potential of said one end of said leak-monitoring capacitor by an amount of the increase or decrease in said second potential.

13. A semiconductor storage device as claimed in claim 1, wherein
said bit lines are connected with a substrate by diffusion contacts, and the leak generated at the bit line pre-charge potential line is a leak from said diffusion contacts of the bit lines to the substrate.

14. A dynamic type semiconductor storage device having a refresh function, comprising:
a back bias voltage generator for detecting a potential of a semiconductor substrate to supply said semiconductor substrate with specified electric charges in a specified cycle when the potential of said semiconductor substrate falls out of a specified range, thereby putting the potential of the semiconductor substrate back into the specified range: and
a refresh timer circuit for outputting a refresh clock signal to refresh memory cells in a cycle corresponding to a cycle to increase and decrease in the potential of said semiconductor substrate, wherein
said back bias voltage generator comprises:
substrate potential detecting means for detecting the potential of the semiconductor substrate, and outputting a detection signal when detecting the potential of the semiconductor substrate out of the specified range;
oscillating means for oscillating upon receiving said detection signal from said substrate potential detecting means; and
electric charge supplying means operating, in response to an oscillation signal received from said oscillating means, to supply the semiconductor substrate with an amount of electric charges corresponding to a frequency of the oscillation signal, and
said refresh timer circuit comprises:
a counter circuit for counting the oscillation signal received from said oscillating means, and outputting the refresh clock signal when a count of the oscillation signal reaches a specified value.

15. The semiconductor storage device as claimed in claim 14, wherein
said oscillating means comprises a ring oscillator.

16. The semiconductor storage device as claimed in claim 15, wherein
said ring oscillator comprises:
a logic circuit constructed of either a NAND gate or a NOR gate, and an inverter array including an even number of inverters connected in series with an output of said logic circuit, wherein the detection signal output from said substrate potential detecting means and an output signal of said inverter array are respectively supplied to inputs of said logic circuit.

* * * * *